United States Patent
Chang

(10) Patent No.: US 7,530,732 B2
(45) Date of Patent: May 12, 2009

(54) APPARATUS FOR MAKING THERMAL INTERFACE MATERIAL WITH A CYLINDRICAL ROTOR

(75) Inventor: Chun-Yi Chang, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 330 days.

(21) Appl. No.: 11/432,587

(22) Filed: May 10, 2006

(65) Prior Publication Data

US 2007/0079757 A1 Apr. 12, 2007

(30) Foreign Application Priority Data

Oct. 11, 2005 (CN) .......................... 2005 1 0100391

(51) Int. Cl.
*B01F 7/28* (2006.01)
(52) U.S. Cl. ..................................... 366/305; 366/307
(58) Field of Classification Search .......... 366/279–331
See application file for complete search history.

(56) References Cited

U.S. PATENT DOCUMENTS

| | | | | |
|---|---|---|---|---|
| 2,474,006 A | * | 6/1949 | Maycock | 261/83 |
| 2,474,007 A | * | 6/1949 | Maycock | 261/83 |
| 2,969,960 A | * | 1/1961 | Gurley, Jr. | 366/303 |
| 2,970,817 A | * | 2/1961 | Gurley, Jr. | 366/305 |
| 3,333,828 A | * | 8/1967 | Boehme | 366/305 |
| 3,438,742 A | * | 4/1969 | Grunewald et al. | 422/205 |
| 3,471,131 A | * | 10/1969 | Fritzweiler et al. | 366/305 |
| 3,774,887 A | * | 11/1973 | Dunn | 422/133 |
| 4,368,174 A | * | 1/1983 | Valyocsik | 422/208 |
| 4,416,548 A | * | 11/1983 | Carre et al. | 366/171.1 |
| 4,744,521 A | * | 5/1988 | Singer et al. | 241/66 |
| 5,141,328 A | * | 8/1992 | Dilley | 366/305 |
| 5,254,076 A | * | 10/1993 | Chow et al. | 494/37 |
| 5,538,343 A | * | 7/1996 | Tynan | 366/305 |
| 5,676,464 A | * | 10/1997 | Mattar | 366/282 |
| 6,386,751 B1 | * | 5/2002 | Wootan et al. | 366/170.3 |
| 6,605,238 B2 | | 8/2003 | Nguyen et al. | |
| 7,121,714 B2 | * | 10/2006 | Parker Metcalfe, III et al. | 366/175.1 |
| 2003/0077478 A1 | | 4/2003 | Dani et al. | |

FOREIGN PATENT DOCUMENTS

| | | |
|---|---|---|
| CN | 2216859 Y | 1/1996 |
| CN | 1676208 A | 10/2005 |
| JP | 03068438 A * | 3/1991 |
| JP | 06114254 A * | 4/1994 |
| JP | 2000094438 A * | 4/2000 |
| JP | 2002045671 A * | 2/2002 |

* cited by examiner

*Primary Examiner*—Charles E Cooley
(74) *Attorney, Agent, or Firm*—Wei Te Chung

(57) ABSTRACT

An apparatus for making thermal interface material includes a container and a stirrer. The container has a cylindrical inner wall and a bottom. The stirrer includes a rotor and a motor for driving the rotation of the rotor. The rotor includes a distal end having a cylindrical side surface separated by predetermined distance from the cylindrical inner wall.

9 Claims, 6 Drawing Sheets

APPARATUS FOR MAKING THERMAL INTERFACE MATERIAL WITH A CYLINDRICAL ROTOR

BACKGROUND

1. Technical Field

The present invention relates to thermal interface materials, and more particularly to an apparatus for making thermal interface material.

2. Description of the Related Art

In recent years, with the ongoing development of electronic technology, semiconductor devices have increased both in their operating frequency and speed, with ever smaller miniaturization and packaging. Heat dissipation has thus become an important problem for semiconductor devices. In order to solve the problem, some heat sinks, such as heat fans, water-cooling devices, and heat pipes, are used to dissipate the heat. Thermal interface material is also used between the heat sink and the semiconductor device to increase efficiency of heat dissipation.

In order to obtain high thermal conductivity, some particles with high thermal coefficient, such as graphite, boron nitride, aluminium oxide, or silver, are mixed with a polymer compound to make a composite thermal interface material.

Referring to FIG. 1, a typical apparatus 1 for making thermal interface material is shown. The apparatus 1 includes a container 2 and a stirrer 3 operating in the container 2. The stirrer 3 generally uses a plurality of distal vanes 4 to stir a matrix material 5 and thermal particles 6 in the container 2. When using the apparatus 1 to make the thermal interface material, the matrix material 5 and the thermal particles 6 are put into the container 2. The stirrer 3 rotates along with the distal vanes 4, and then the distal vanes 4 stir the matrix material 5 and the thermal particles 6 to make thermal interface material.

However, when the mass of the thermal particles 6 is larger than that of the matrix material 5, the thermal interface material has a high viscosity. Thus when the apparatus 1 is used to mix the proportion above of the matrix material 5 and the thermal particles 6, the matrix material 5 and the thermal particles 6 adhere to the stirrer 3. Thus the stirrer 3 hardly stirs the matrix 5 and the thermal particles 6 and the apparatus 1 cannot operate normally. Therefore, the matrix material 5 and thermal particles 6 are not mixed uniformly so that high thermal conductivity of the interface material is not achieved.

What is needed, therefore, is an apparatus for making thermal interface material that can mix the matrix material uniformly with the thermal particles having larger mass than that of the matrix material.

SUMMARY

In a preferred embodiment, an apparatus for making thermal interface material includes a container and a stirrer. The container has a cylindrical inner wall and a bottom. The stirrer includes a rotor and a motor for driving the rotation of the rotor. The rotor includes a distal end having a cylindrical side surface separated by a predetermined distance from the cylindrical inner wall.

Other advantages and novel features will become more apparent from the following detailed description of the present apparatus for making thermal interface material when taken in conjunction with the accompanying drawings.

BRIEF DESCRIPTION OF THE DRAWINGS

Many aspects of the apparatus for making thermal interface material can be better understood with reference to the following drawings. The components in the drawings are not necessarily drawn to scale, the emphasis instead being placed upon clearly illustrating the principles of the present invention. Moreover, in the drawings, like reference numerals designate corresponding parts throughout the several views.

DETAILED DESCRIPTION OF PREFERRED EMBODIMENTS

Figure 1:
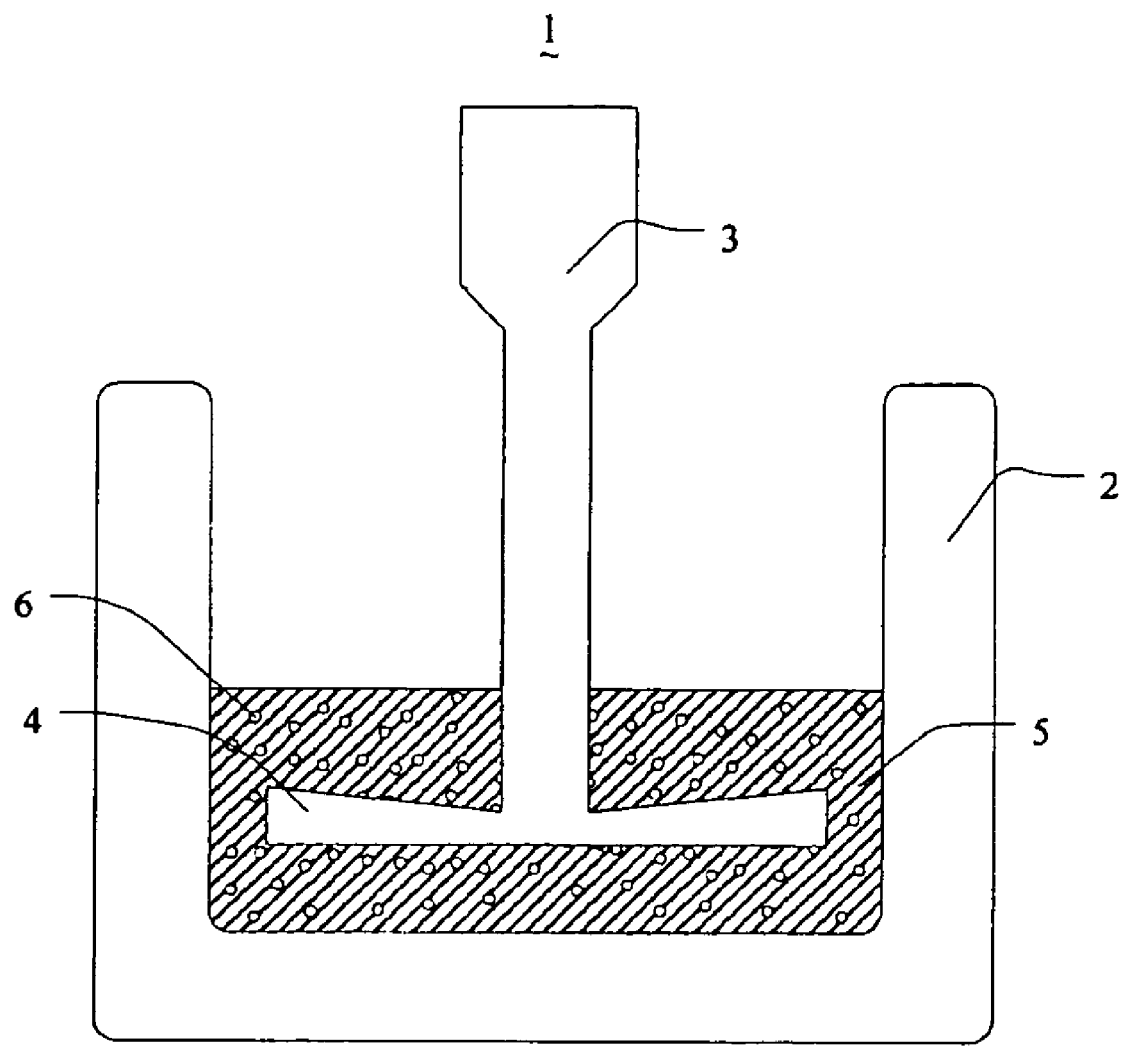
FIG. 1 is a schematic, plan view of a typical apparatus for making thermal interface material in operation.

Reference will now be made to the drawing figures to describe the preferred embodiment of the present apparatus for making thermal interface material in detail.

Figure 2:
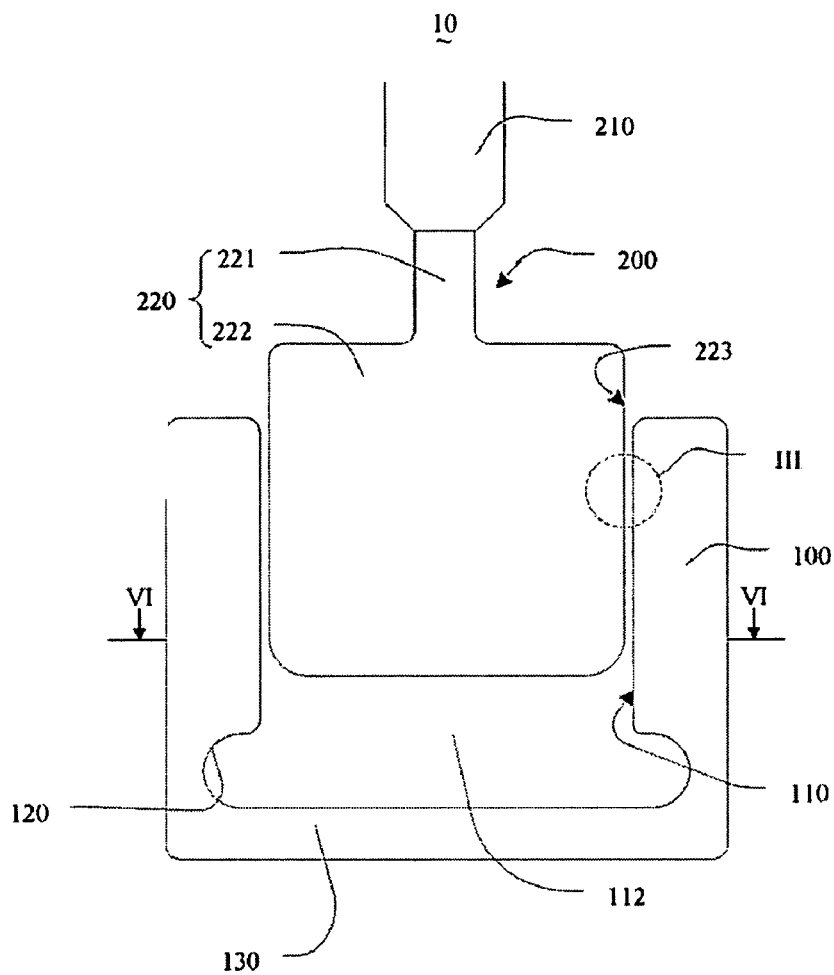
FIG. 2 is a schematic, plan view of an apparatus for making thermal interface material, in accordance with a first preferred embodiment.
Figure 3:
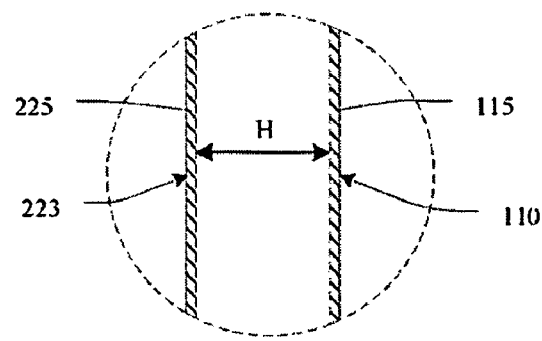
FIG. 3 is an enlarged view of a circled portion III in FIG. 2.

Referring to FIGS. 2 and 3, an apparatus 10 for making thermal interface material is shown in accordance with a first embodiment. The apparatus 10 comprises a container 100 and a stirrer 200 operating in the container 100.

The container 100 comprises an inner wall 110, a bottom 130, and an annular groove 120 adjacent to the bottom 130. The inner wall 110 and the bottom 130 form an approximately cylindrical shape.

Figure 6:
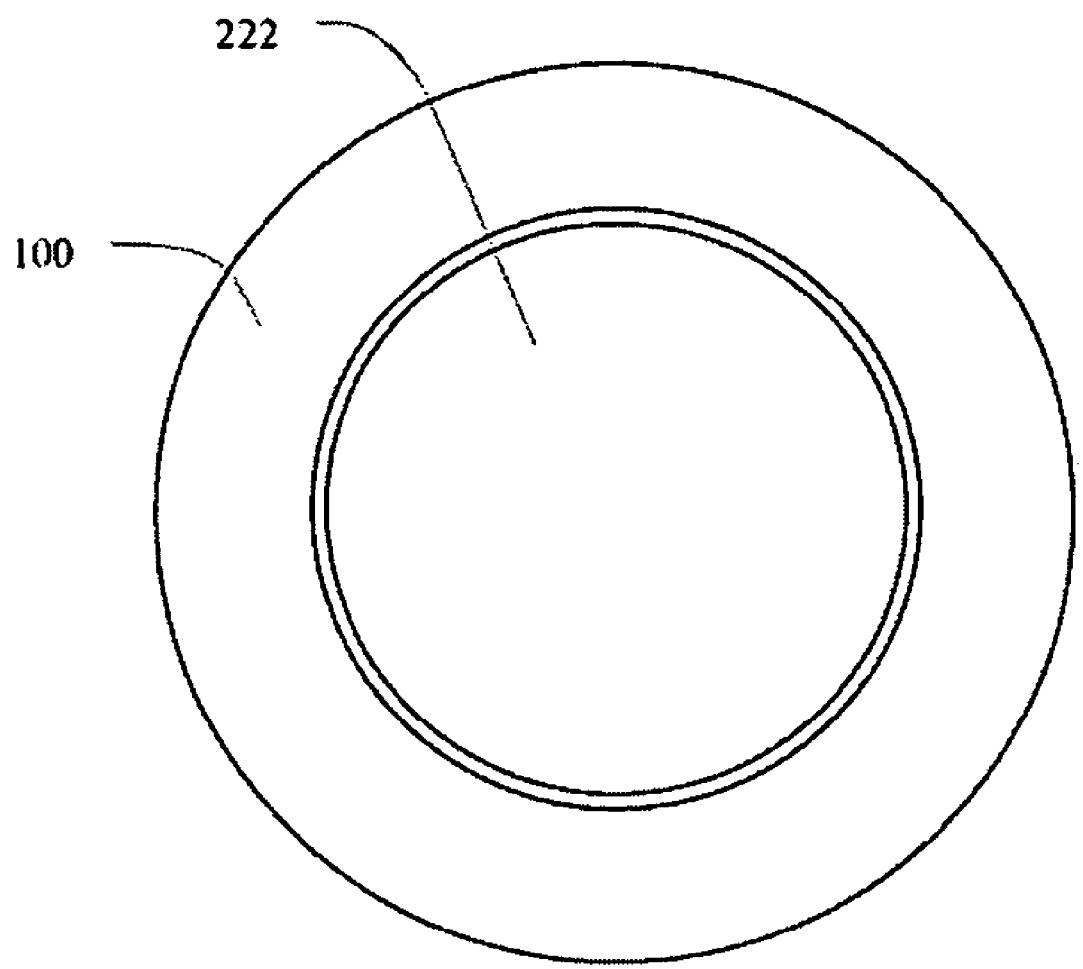
FIG. 6 is a cross-sectional overview taken along the line VI-VI of FIG. 2.

The stirrer 200 includes a motor 210 and a rotor 220. The rotor 220 comprises a distal end 222, and a connection end 221 connected with the motor 210. The sectional shape of the distal end 222 of the rotor 220 in the container 100 is depicted in FIG. 6. The inner wall 110 together with the bottom 130 and the distal end 222 defines a mixing space 112. The distal end 222 has a cylindrical side surface 223. When the apparatus 10 is working, the distal end 222 can be put into the container 100 and the motor 210 can drive the distal end 222 to rotate. The cylindrical side surface 223 and the inner wall 110 are spaced at a predetermined distance labeled with a reference character H when an axis of the cylindrical side surface 223 and the axis of the inner wall 110 are aligned. A TEFLON® coat 115, i.e., a coating of polytetrafluoroethelyne, is coated on the inner wall 110; and a TEFLON® coat 225, i.e., a coating of polytetrafluoroethelyne, is coated on the cylindrical side surface 223.

A value of H is in the range from about 0.5 millimeters to about 10 millimeters. In this embodiment, the value of H is about 1 millimeter. Thus the diameter of the inner wall 110 is 2 millimeters larger than that of the cylinder surface 223.

The motor 210 used can be either a direct current (DC) motor or an alternating current (AC) motor.

The rotor 222 can be made of wear-resistant material, for example, marble or stainless steel.

Figure 4:
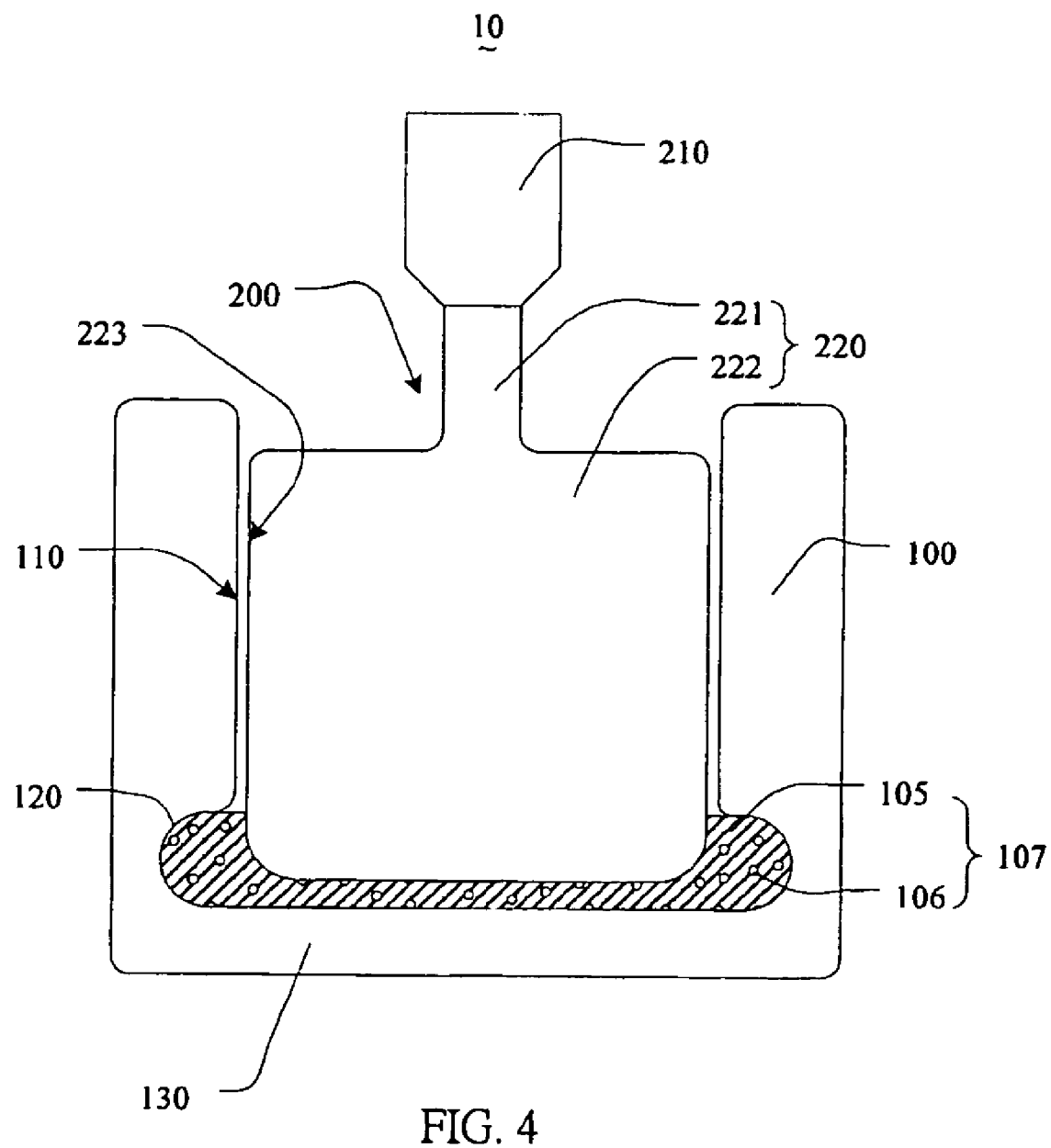
FIG. 4 is a schematic, plan view of the apparatus for making thermal interface material of FIG. 2 in operation.

Referring to FIG. 4, a mixture 107 comprising a matrix material 105 and thermal particles 106 is put in the container 110. A ratio between the masses of the matrix material 105 and the thermal particles 106 can be in the range from about 1:3 to about 1:5. The matrix material 105 includes silicone oil or polyethylene glycol (PEG). The thermal particle 106 is silver (Ag), boron nitride (BN), or aluminium oxide ($Al_2O_3$).

When the apparatus 10 working, the motor 210 drives the rotor 220 via the connection end 221 and then the distal end 222 presses on the mixture 107 and stirs it. The rotor 220 can rotate at 10 to 200 revolutions per minute (RPM). In this embodiment, the RPM of the rotor 220 is 20 RPM.

The mixture 107 is squeezed into the mixing space 112 by the distal end 222. Under the pressure of the distal end 222, a portion of the mixture 107 enters the groove 120. With shear force and pressure of the distal end 222, the mixture 107 can be mixed uniformly. The value of H is very small, and thus the mixture 107 in the groove 120 is mixed repeatedly in the groove 120 and is not extracted out of the mixing space 112.

The distal end 222 of the rotor 220 rotates and generates shear force, and the mixture 107 is mixed under the function of the shear force. The TEFLON® coats 115 and 225 can prevent the mixture 107 from adhering to the inner wall 110 and the distal end 222.

Figure 5:
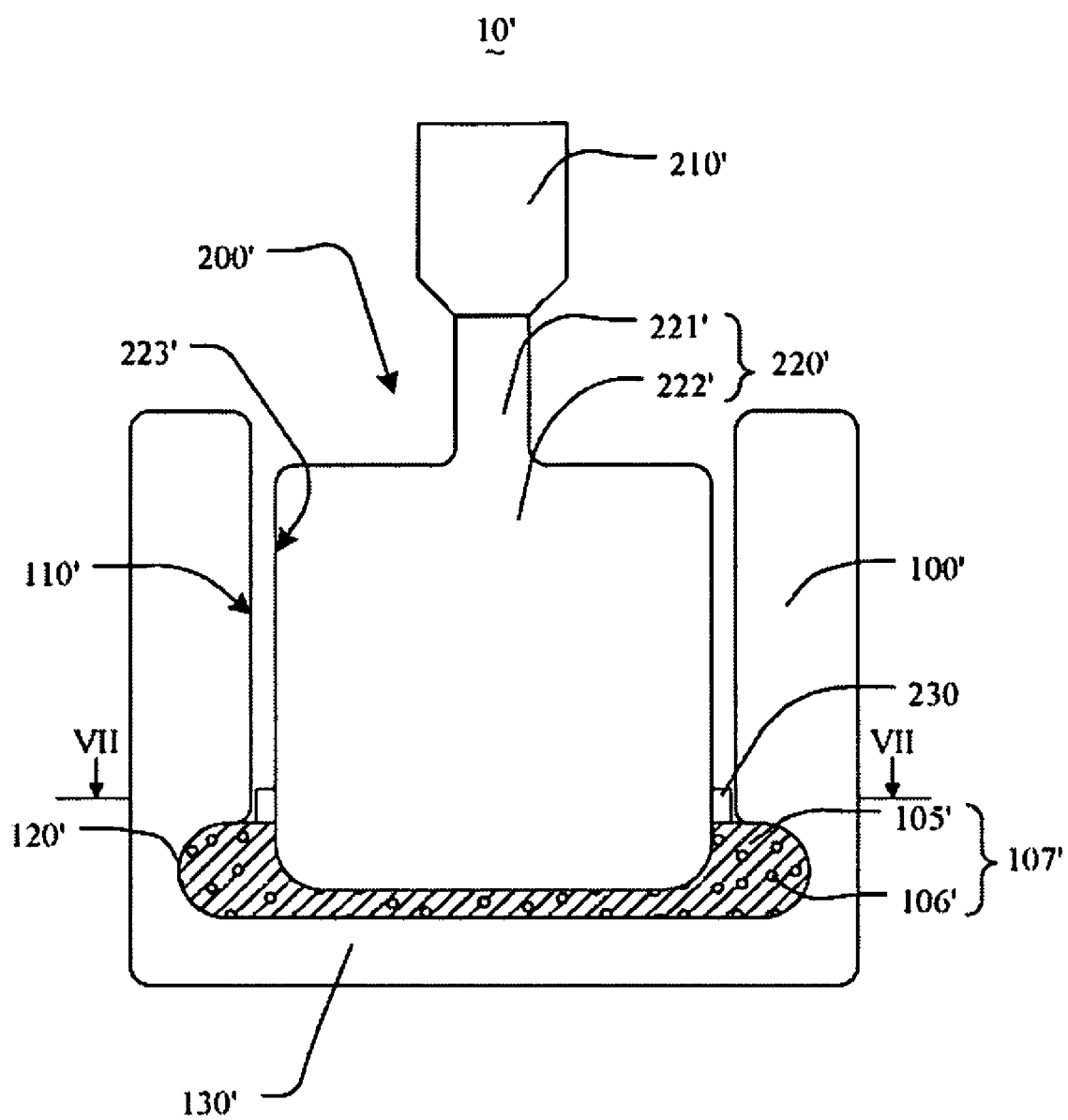
FIG. 5 is a schematic, plan view of an apparatus for making thermal interface material, in accordance with a second preferred embodiment.

Referring to FIG. 5, another apparatus 10' for making thermal interface material is shown in accordance with a second embodiment. The apparatus 10' includes a container 100' and a stirrer 200' operating in the container 100'.

The container 100' includes an inner wall 110', a bottom 130', and an annular groove 120' adjacent to the bottom 130'. A TEFLON® coat (not shown) is coated on the inner wall 110', similar to FIG. 3.

The stirrer 200' includes a motor 210', and a rotor 220' comprising a distal end 222'and a connection end 221'. The connection end 221' connects the motor 210' and the distal end 222'. The distal end 222' has a cylindrical side surface 223'. A TEFLON® coat (not shown) is coated on the cylindrical side surface 223'.

Figure 7:
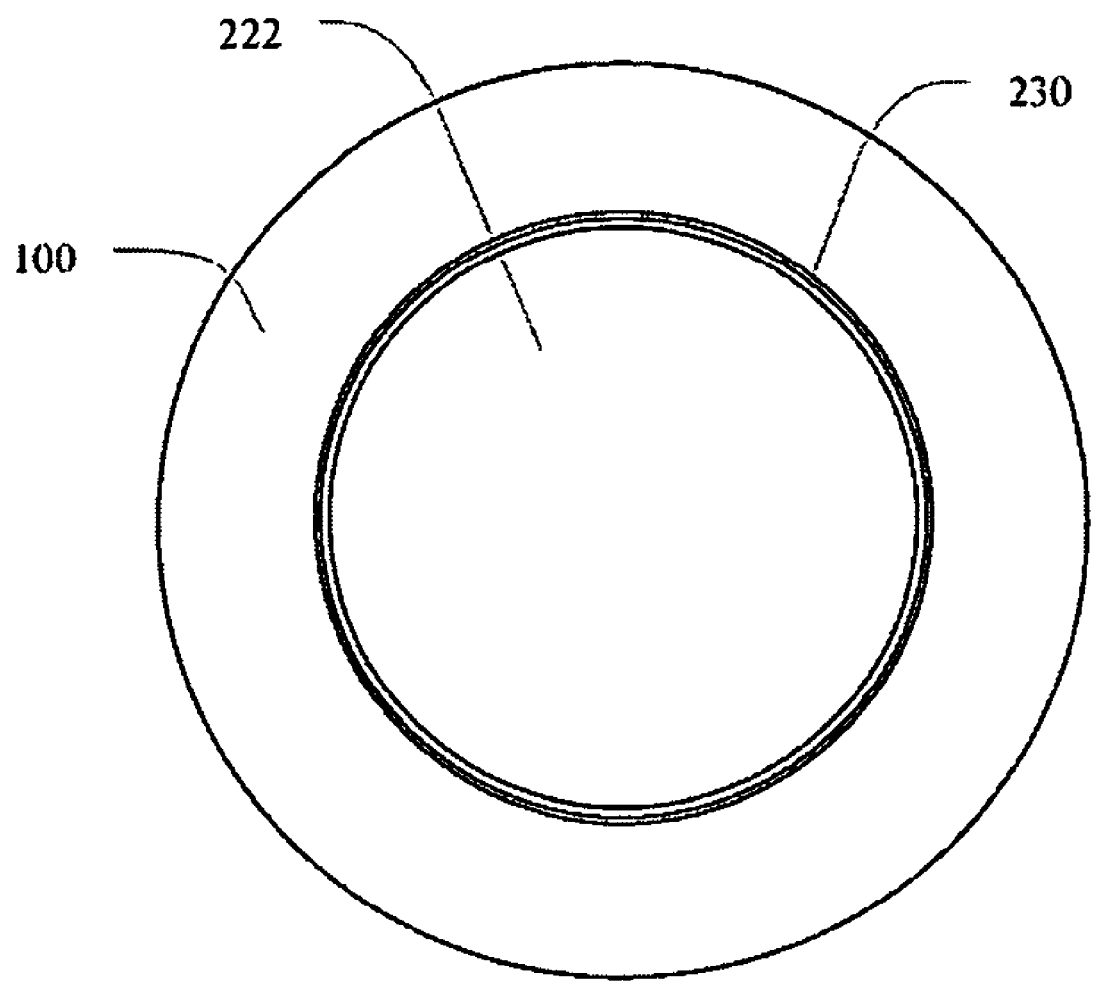
FIG. 7 is a cross-sectional overview taken along the line VII-VII of FIG. 5.

The difference between the apparatus 10' and the apparatus 10 is that the apparatus 10' further includes a flange 230 formed on the cylindrical side surface 223', thereby the flange 230 has an annular shape, as depicted in FIG. 7.

The flange 230 and the bottom of the cylindrical side surface 223' are spaced at a distance. A predetermined clearance of about 0.5 millimeters to about 5 millimeters is defined between the inner wall 110' and the flange 230, and a width of about 5 millimeters separates the cylindrical side surface 223' and the inner wall 110'. In this embodiment, a value of the predetermined clearance is 1 millimeter. When the axes of the cylindrical side surface 223' and the inner wall 110' are aligned, the diameter of the inner wall 110' is 2 millimeters larger than that of the flange 230, and the diameter of the inner wall 110' is 10 millimeters larger than that of the cylindrical side surface 223'. The flange 230 is made of wear-resistant material, such as marble, stainless steel, or TEFLON®.

When using the apparatus 10' makes thermal interface material, a mixture 107' comprising matrix material 105' and thermal particles 106' is put into the container 110'. Under pressure of the distal end 222', a portion of the mixture 107' enters the groove 120'. With shear force and pressure of the distal end 222' the mixture 107' can be mixed uniformly. A small clearance defined by the flange 230 and the inner wall 110' can prevent the mixture 107' from leaking out of the mixing space.

Although the present invention has been described with reference to specific embodiments, it should be noted that the described embodiments are not necessarily exclusive, and that various changes and modifications may be made to the described embodiments without departing from the scope of the invention as defined by the appended claims.

What is claimed is:

1. An apparatus for making thermal interface material, comprising:

a container having a cylindrical inner wall and a bottom adjoining the cylindrical inner wall;

a stirrer comprising a rotor and a motor for driving the rotation of the rotor, the rotor having a distal end, the distal end having a cylindrical side surface separated by a predetermined distance from the cylindrical inner wall; and an annular groove defined in the cylindrical inner wall of the container, the annular groove being defined at a neighboring region of the cylindrical inner wall and the bottom, and the annular groove adjoining the bottom.

2. The apparatus as claimed in claim 1, wherein the distance is in the range from 0.5 millimeters to 10 millimeters.

3. The apparatus as claimed in claim 1, wherein the motor is one of a direct current motor and an alternating current motor.

4. The apparatus as claimed in claim 1, wherein a material of the rotor is made of a material chosen from the group consisting of stainless steel and marble.

5. The apparatus as claimed in claim 1, wherein the distal end farther comprises an annular flange formed on the cylindrical side surface.

6. The apparatus as claimed in claim 5, wherein the flange is spaced at a distance of 0.5 millimeters to 5 millimeters from the cylindrical inner wall.

7. The apparatus as claimed in claim 5, wherein a material of the flange is selected from the group consisting of marble, stainless steel, and polytetrafluoroethelyne.

8. The apparatus as claimed in claim 1, wherein a polytetrafluoroethelyne coating is formed on the cylindrical inner wall of the container.

9. The apparatus as claimed in claim 1, wherein a polytetrafluoroethelyne coating is formed on the cylindrical side surface of the distal end.

* * * * *